US 11,437,104 B2

(12) United States Patent
Sharma et al.

(10) Patent No.: US 11,437,104 B2
(45) Date of Patent: Sep. 6, 2022

(54) STORAGE SYSTEM AND METHOD FOR A HYBRID QUAD-LEVEL CELL (QLC) WRITE SCHEME FOR REDUCED RANDOM ACCESS MEMORY (RAM) FOOTPRINT

(71) Applicant: Western Digital Technologies, Inc., San Jose, CA (US)

(72) Inventors: Amit Sharma, Karnataka (IN); Sourabh Sankule, Karnataka (IN); Dinesh Kumar Agarwal, Karnataka (IN); Chetan Agrawal, Karnataka (IN)

(73) Assignee: Western Digital Technologies, Inc., San Jose, CA (US)

( * ) Notice: Subject to any disclaimer, the term of this patent is extended or adjusted under 35 U.S.C. 154(b) by 32 days.

(21) Appl. No.: 17/181,709

(22) Filed: Feb. 22, 2021

(65) Prior Publication Data

US 2022/0076753 A1    Mar. 10, 2022

Related U.S. Application Data

(60) Provisional application No. 63/075,396, filed on Sep. 8, 2020.

(51) Int. Cl.
*G11C 16/10*    (2006.01)
*G11C 16/34*    (2006.01)
*G11C 16/26*    (2006.01)

(52) U.S. Cl.
CPC .............. *G11C 16/10* (2013.01); *G11C 16/26* (2013.01); *G11C 16/3459* (2013.01)

(58) Field of Classification Search
CPC ..... G11C 16/10; G11C 16/26; G11C 16/3459; G11C 11/5628

USPC ......................................................... 365/189
See application file for complete search history.

(56) References Cited

U.S. PATENT DOCUMENTS

| 8,886,877 | B1 | 11/2014 | Avila et al. |
| 9,141,528 | B2 | 9/2015 | Gorobets et al. |
| 9,176,864 | B2 | 11/2015 | Gorobets et al. |
| 10,275,170 | B2* | 4/2019 | Ravimohan ........... G06F 3/0631 |
| 2011/0149651 | A1 | 6/2011 | Gorobets et al. |
| 2011/0153911 | A1 | 6/2011 | Sprouse et al. |
| 2013/0155769 | A1* | 6/2013 | Li ....................... G11C 16/0483 365/185.03 |
| 2014/0063939 | A1* | 3/2014 | Marcu ................... G11C 16/10 365/185.18 |
| 2016/0225459 | A1 | 8/2016 | Boysan et al. |
| 2018/0067650 | A1* | 3/2018 | Hayakawa .......... G06F 12/0638 |
| 2020/0176055 | A1* | 6/2020 | Shirakawa ......... G11C 16/0483 |

(Continued)

*Primary Examiner* — Huan Hoang
*Assistant Examiner* — Minh Dinh
(74) *Attorney, Agent, or Firm* — Crowell & Moring LLP

(57) ABSTRACT

A storage system and method for a hybrid quad-level cell (QLC) write scheme for reduced random access memory (RAM) footprint and better performance are provided. In one example, a storage system includes a volatile memory and a non-volatile memory. A Foggy program operation is performed in a QLC memory in the non-volatile memory by writing two pages of data into the QLC memory. Then, a Fine program operation is performed in the QLC memory by reading the two pages of data written to the QLC memory in the Foggy program operation, reading two other pages of data from the volatile memory, and writing the two pages of data read from the QLC memory and the two other pages of data read from the volatile memory in the QLC memory.

20 Claims, 12 Drawing Sheets

(56) References Cited

U.S. PATENT DOCUMENTS

| | | | |
|---|---|---|---|
| 2020/0250028 A1* | 8/2020 | Vittal Prabhu | G06F 11/076 |
| 2021/0272639 A1* | 9/2021 | Dhotre | G06F 9/542 |

* cited by examiner

| WL# | Program Stage | Program Order ||||
|---|---|---|---|---|---|
| | | String 0 | String 1 | String 2 | String 3 |
| | Foggy | 0 | 1 | 2 | 3 |
| WL0 | Fine | 5 | 7 | 9 | 11 |
| | Foggy | 4 | 6 | 8 | 10 |
| WL1 | Fine | 13 | 15 | 17 | 19 |
| | Foggy | 12 | 14 | 16 | 18 |
| WL2 | Fine | 21 | 23 | 25 | 27 |
| WL3 | Foggy | 20 | 22 | 24 | 26 |
| ... | ... | ... | ... | ... | ... |
| WL93 | Fine | 749 | 751 | 753 | 755 |
| | Foggy | 748 | 750 | 752 | 754 |
| WL94 | Fine | 757 | 759 | 761 | 763 |
| | Foggy | 756 | 758 | 760 | 762 |
| WL95 | Fine | 764 | 765 | 766 | 767 |

FIG. 4

STORAGE SYSTEM AND METHOD FOR A HYBRID QUAD-LEVEL CELL (QLC) WRITE SCHEME FOR REDUCED RANDOM ACCESS MEMORY (RAM) FOOTPRINT

CROSS-REFERENCE TO RELATED APPLICATION

This application claims the benefit of U.S. provisional patent application No. 63/075,396, filed Sep. 8, 2020, which is hereby incorporated by reference.

BACKGROUND

When writing data to a non-volatile memory having a multi-level cell (MLC) configuration, the process is typically accomplished by storing each of the plurality of bits for a cell in random access memory (RAM) in the memory controller for all the cells in a complete wordline in the memory and then proceeding with a multiple-stage programming process for injecting charge into each multi-bit cell to achieve the programmed state desired for that cell. Usually, the multi-stage programming involves initially programming part of the states with widened voltage distributions (i.e., "Foggy" programming step), followed by final programming of all the states with tight voltage distribution (i.e., "Fine" programming step).

BRIEF DESCRIPTION OF THE DRAWINGS

FIG. 4 is a diagram illustrating a program order of an embodiment.

DETAILED DESCRIPTION

Figure 1A:
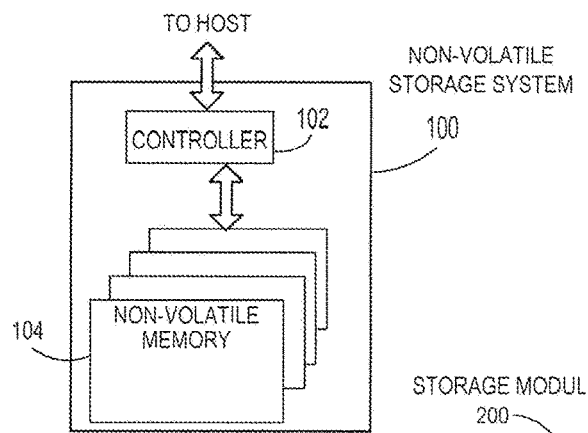
FIG. 1A is a block diagram of a non-volatile storage system of an embodiment.
Figure 1B:
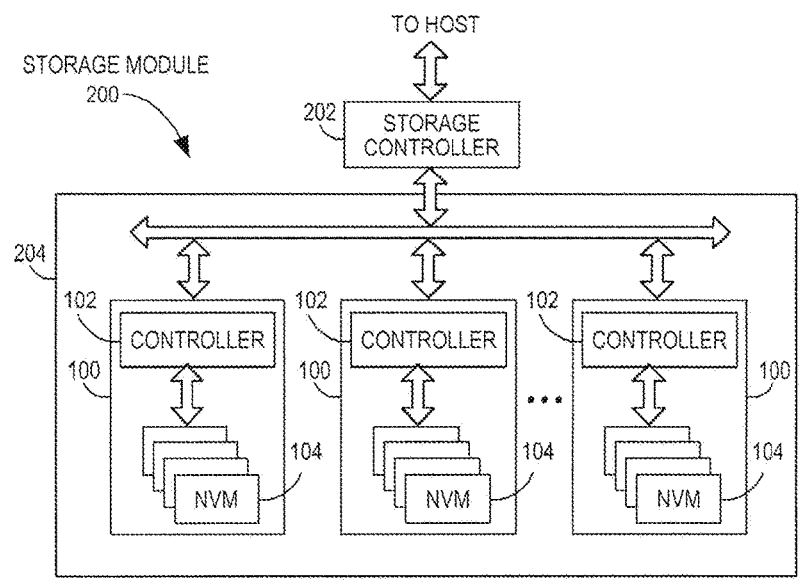
FIG. 1B is a block diagram illustrating a storage module of an embodiment.
Figure 1C:
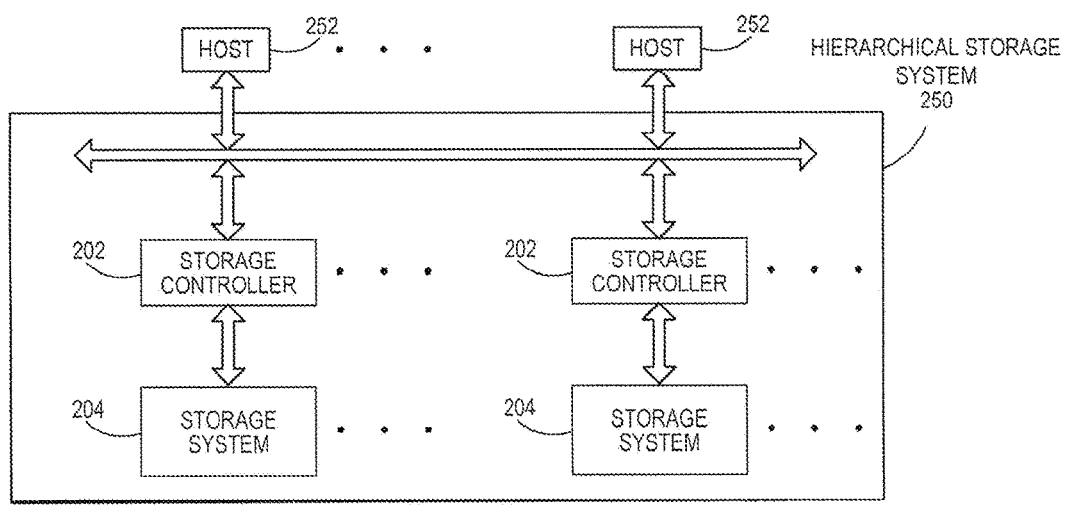
FIG. 1C is a block diagram illustrating a hierarchical storage system of an embodiment.

Turning now to the drawings, storage systems suitable for use in implementing aspects of these embodiments are shown in FIGS. 1A-1C. FIG. 1A is a block diagram illustrating a non-volatile storage system 100 (sometimes referred to herein as a storage device or just device) according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a non-volatile memory controller (e.g., a flash, resistive random-access memory (ReRAM), phase-change memory (PCM), or magneto-resistive random-access memory (MRAM) controller)) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. A non-volatile memory controller can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. (Alternatively, the host can provide the physical address.) The non-volatile memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused). Also, the structure for the "means" recited in the claims can include, for example, some or all of the structures of the controller described herein, programmed or manufactured as appropriate to cause the controller to operate to perform the recited functions.

Non-volatile memory die 104 may include any suitable non-volatile storage medium, including resistive random-access memory (ReRAM), magneto-resistive random-access memory (MRAM), phase-change memory (PCM), NAND flash memory cells and/or NOR flash memory cells.

The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card based system, such as a secure digital (SD) or a micro secure digital (micro-SD) card. In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some storage system architectures (such as the ones shown in FIGS. 1B and 1C), 2, 4, 8 or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA), peripheral component interconnect express (PCIe) interface, or double-data-rate (DDR) interface. Storage module 200, in one embodiment, may be a solid state drive (SSD), or non-volatile dual in-line memory module (NVDIMM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be a Non-Volatile Memory Express (NVMe) or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2:
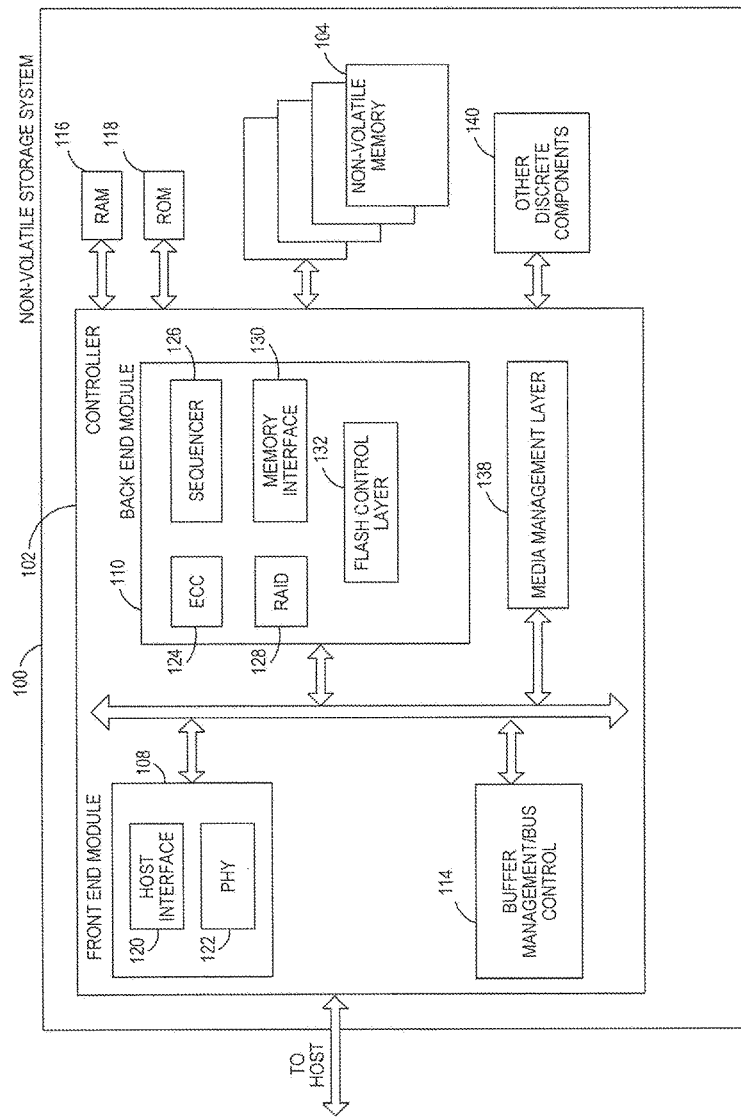
FIG. 2 is a block diagram illustrating components of the controller of the non-volatile storage system illustrated in FIG. 1A according to an embodiment.

FIG. 2 is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. The controller 102 may sometimes be referred to herein as a NAND controller or a flash controller, but it should be understood that the controller 102 can be used with any suitable memory technology, example of some of which are provided below.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2 as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 3:
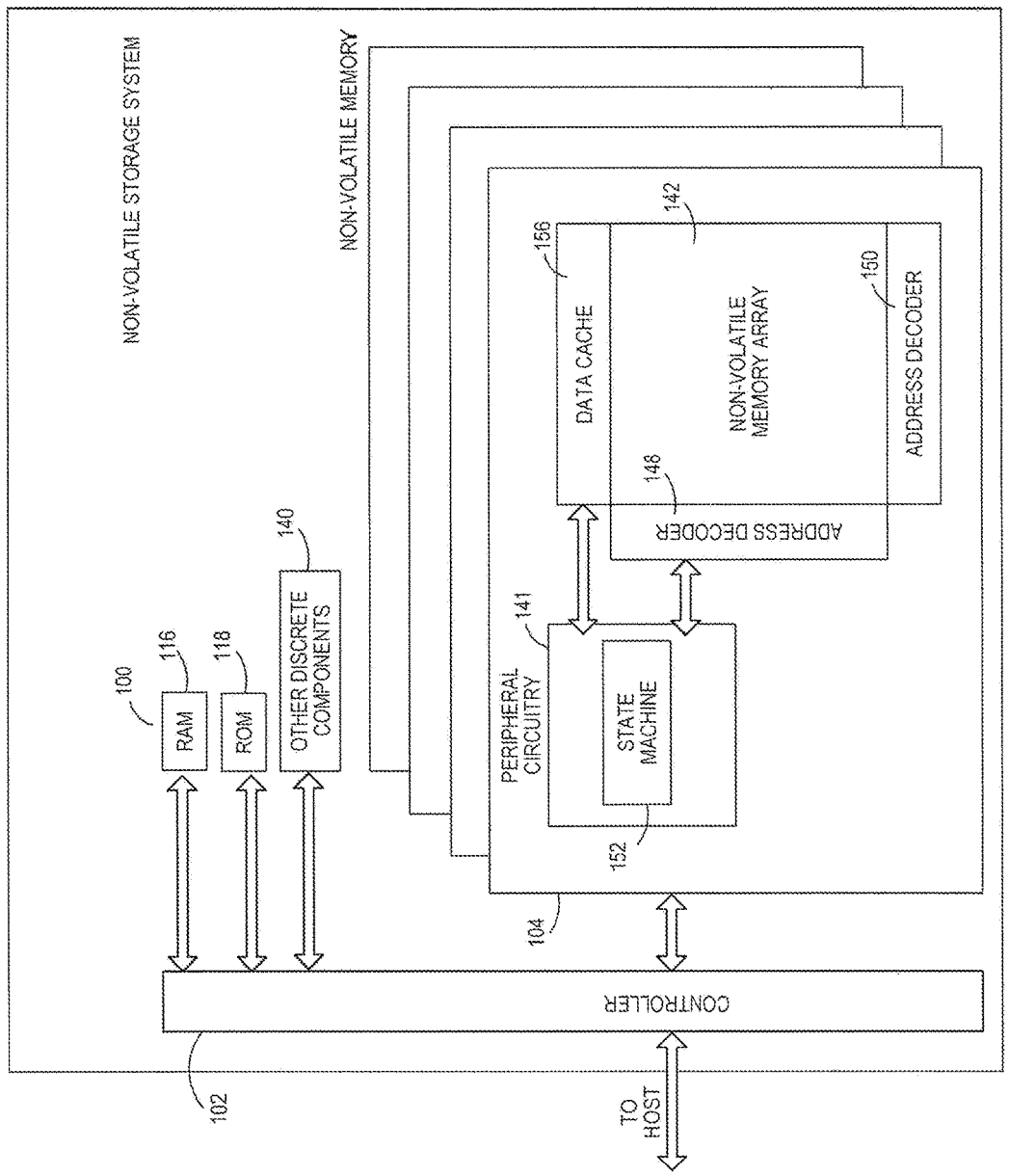
FIG. 3 is a block diagram illustrating components of the non-volatile storage system illustrated in FIG. 1A according to an embodiment.

FIG. 3 is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two dimensional and/or three dimensional configuration. Non-volatile memory die 104 further includes a data cache 156 that caches data. Peripheral circuitry 141 includes a state machine 152 that provides status information to the controller 102.

Returning again to FIG. 2, the flash control layer 132 (which will be referred to herein as the flash translation layer (FTL) or, more generally, the "media management layer," as the memory may not be flash) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may only be written in multiples of pages, and/or may not be written unless it is erased as a block. The FTL understands these potential limitations of the memory 104, which may not be visible to the host. Accordingly, the FTL attempts to translate the writes from host into writes into the memory 104.

The FTL may include a logical-to-physical address (L2P) map (sometimes referred to herein as a table or data structure) and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

As mentioned above, when writing data to a non-volatile memory having a multi-level cell (MLC) configuration, the process is typically accomplished by storing each of the plurality of bits for a cell in random access memory (RAM) in the memory controller for all the cells in a complete wordline in the memory and then proceeding with a multiple-stage programming process for injecting charge into each multi-bit cell to achieve the programmed state desired for that cell. Usually, the multi-stage programming involves initially programming part of the states with widened voltage distributions (i.e., the "Foggy" programming step), followed by final programming of all the states with tight voltage distribution (i.e., the "Fine" programming step). As part of this multiple-step programming process, and for each of the multiple programming steps, memory in the controller stores a copy of all the data bits to be programmed in a cell and processes the error correction code (ECC) bits for the data. In case the data programmed at the Foggy programming step is read from the memory array without error or decoded within the memory die for enabling the following Fine programming step, the Foggy data does not need to be stored aside temporarily in the memory controller until the Fine step, which allows the memory buffer within the memory controller to be reduced in size. Foggy-Fine programming schemes are well known for programming multi-level cell memories.

When an error-free internal Foggy read within the memory die (i.e., the Internal Data Load (IDL) read) is not possible, the Foggy data needs to be stored temporarily in a write buffer within the memory controller in order to be re-used during the Fine stage. The size of the memory write buffer required for enabling Foggy-Fine programming grows as the number of memory planes and strings increases, which is the common trend as memory generations advance for sake of memory cost reduction. For example, a memory with 6 strings×4 planes×4 pages of 16 KB per may require a write buffer of ~1.5 MB per memory die, which significantly increases the controller cost. Hence, a scheme that allows for a reliable Foggy read within the memory die (IDL read) is highly desired.

One such scheme is an MLC-Fine programming scheme, in which two pages are programmed during the Foggy stage ("MLC" programming) and two pages are added in the Fine stage. Such MLC-Fine programming significantly reduces the required write buffer to ~128 KB-256 KB per die. Such a programming scheme requires a margin for an MLC internal data load (IDL) read. An IDL read is used to read back memory cells after programming the first page(s) but prior to programming the second page(s). This read can store the first page into a set of data latches on the memory chip and can result in the first page of data being loaded into the data latches without data being transferred off the chip.

One type of MLC memory is a quad-level cell (QLC) memory, and the following paragraphs provide example implementations of various embodiments using QLC memory. It should be noted that these are merely examples, and other forms of MLC memory can be used.

QLC memories can use Foggy-Fine programming to achieve better voltage threshold (Vt) distributions and, hence, a lower bit error rate (BER). Fine programming on a given wordline WL is only attempted when wordline WL+1's Foggy step has been completed. FIG. 4 is a diagram of this program order.

The Foggy state data is not readable; hence, all four pages (lower, middle, upper, and top) are needed to start the Fine operation. This data is either stored in single level cell (SLC) (e.g., in folding architectures) or in RAM. Next generation BiCS (Bit Column Stacked) memories have four planes (each of 16K) and five strings. This increases the write buffer requirements and adds prohibitive DRAM cost for direct-write platforms. For example, the RAM required per die in Foggy-Fine=16 KB*4 planes*4 pages*6 (5+1 strings)=1.5 MB.

Figure 8A:
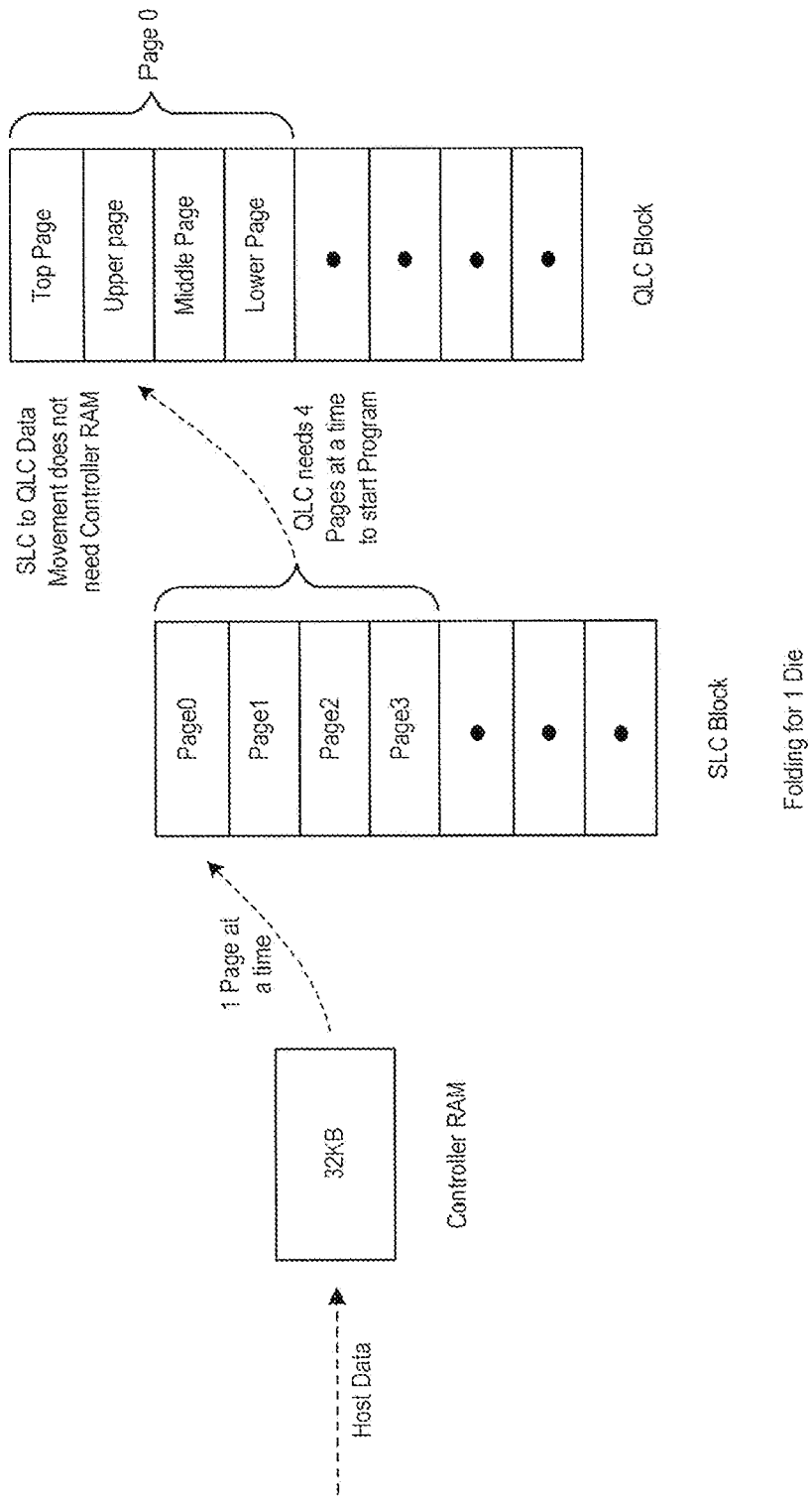
FIG. 8A is a diagram illustrating a folding operation of an embodiment.
Figure 8B:
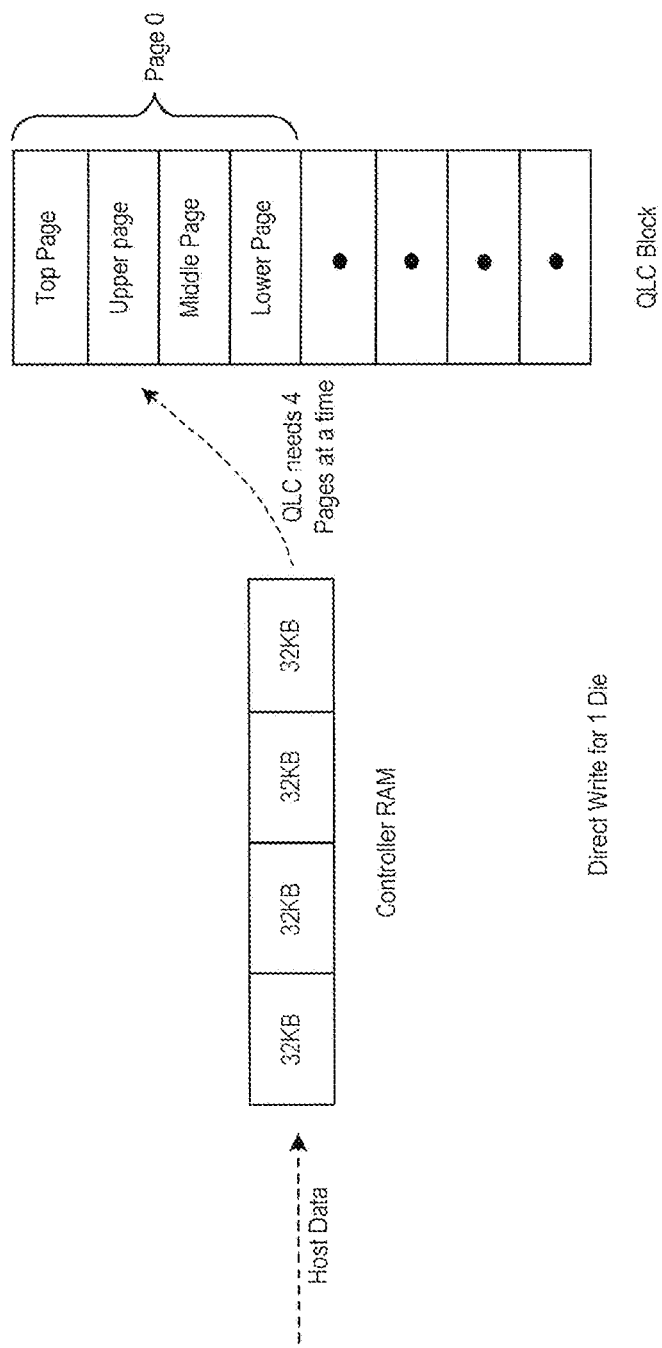
FIG. 8B is a diagram illustrating a direct write operation of an embodiment.

FIGS. 8A and 8B are diagrams illustrating folding and direct write operations, respectively. Direct writes can be used where there are greater buffer requirements, and folding can be used when performance is low.

To reduce the space needed in write buffers, MLC-Fine programming can be used for QLC memories. In MLC-Fine QLC memory, the foggy-fine programming order is the same as present QLC NAND memories. To start the Foggy Stage (MLC write), only two pages of data (lower and middle) are required. Present QLC NAND requires all four pages to start foggy programming. In the proposed algorithm, after the Foggy stage, the lower and middle pages are readable. During the fine stage, the NAND performs an internal read of the lower and middle pages, so the system needs to provide only two pages (upper and top) of data to start the Fine operation. This reduces RAM requirement drastically. For instance, in the above example, the RAM required per die in MLC-Fine=16 KB*4 planes*2 pages*1 (string)=128 KB.

Figure 5A:
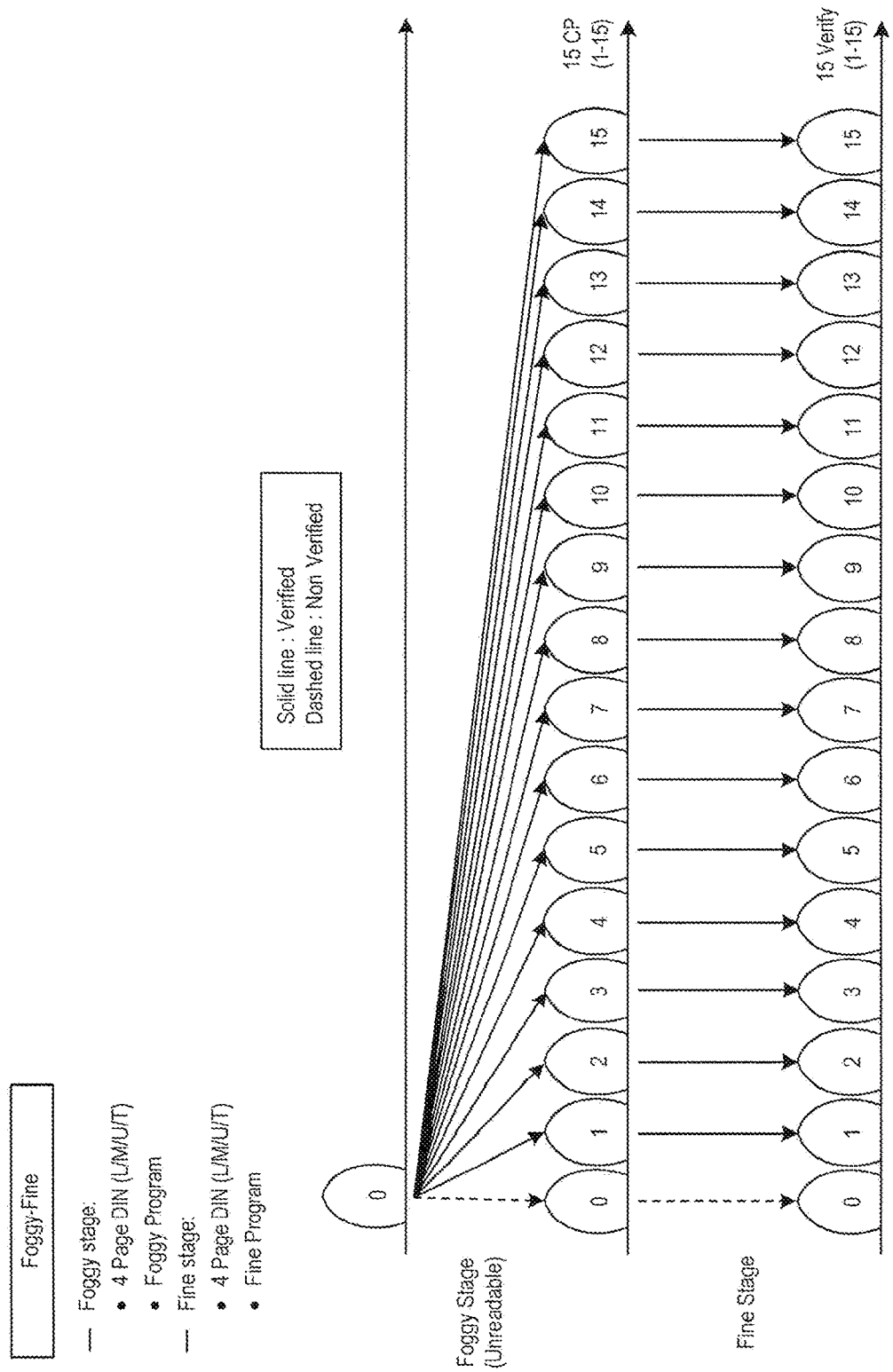
FIG. 5A is a diagram illustrating a Foggy-Fine programming operation of an embodiment.
Figure 5B:
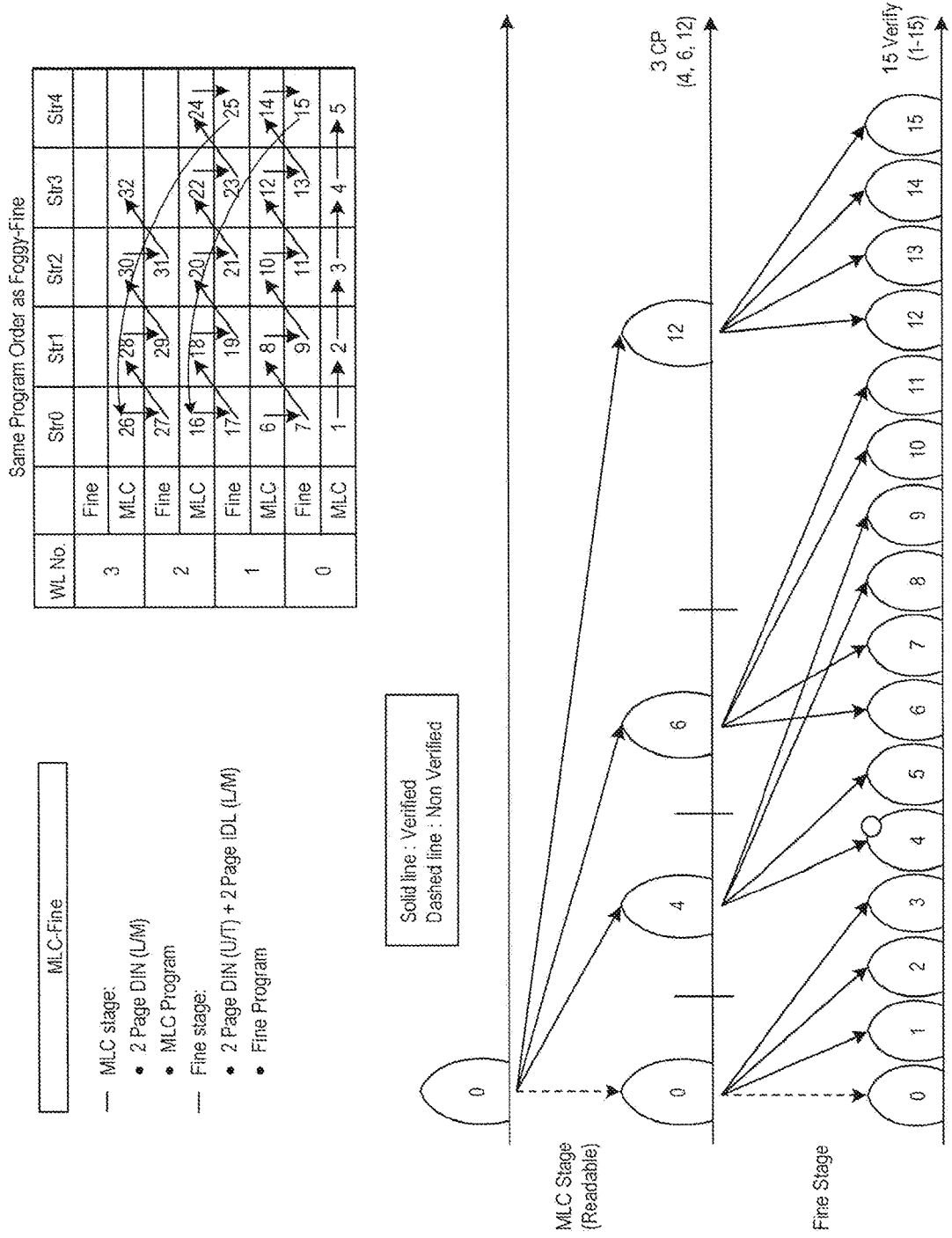
FIG. 5B is a diagram illustrating a multi-level cell (MLC)-Fine programming operation of an embodiment.

FIGS. 5A and 5B illustrate the differences between Foggy-Fine and MLC-Fine NAND.

Most Foggy-Fine programming schemes collect the full QLC page (lower, middle, upper and top) data in RAM and then attempt the QLC write operation. This approach avoids the cases where the firmware has to handle partial QLC page handling (i.e., if enough data in not available for QLC, data has to be programmed to SLC, etc. or has to be padded). The MLC-Fine algorithm reduces the RAM requirement to 128 KB per die. However, for lower- and mid-cost controllers (e.g., DRAM-less controllers), buffer requirements are still huge to enable direct write.

To address the problem, the below embodiments provide a hybrid QLC data routing scheme in which a mix of incoming host data and previously-written data (e.g., from the SLC pool or compaction) is routed to a QLC block. This reduces the controller's RAM requirement, thus enabling lower-cost controllers to get better performance than folding and also reducing write amplification of the device. In these embodiments, hybrid data is routed to QLC memory, and certain pages in the QLC memory will have incoming host data while other pages will have previously-written data. This allows the storage system to perform hybrid routing and folding on different dies.

Figure 6:
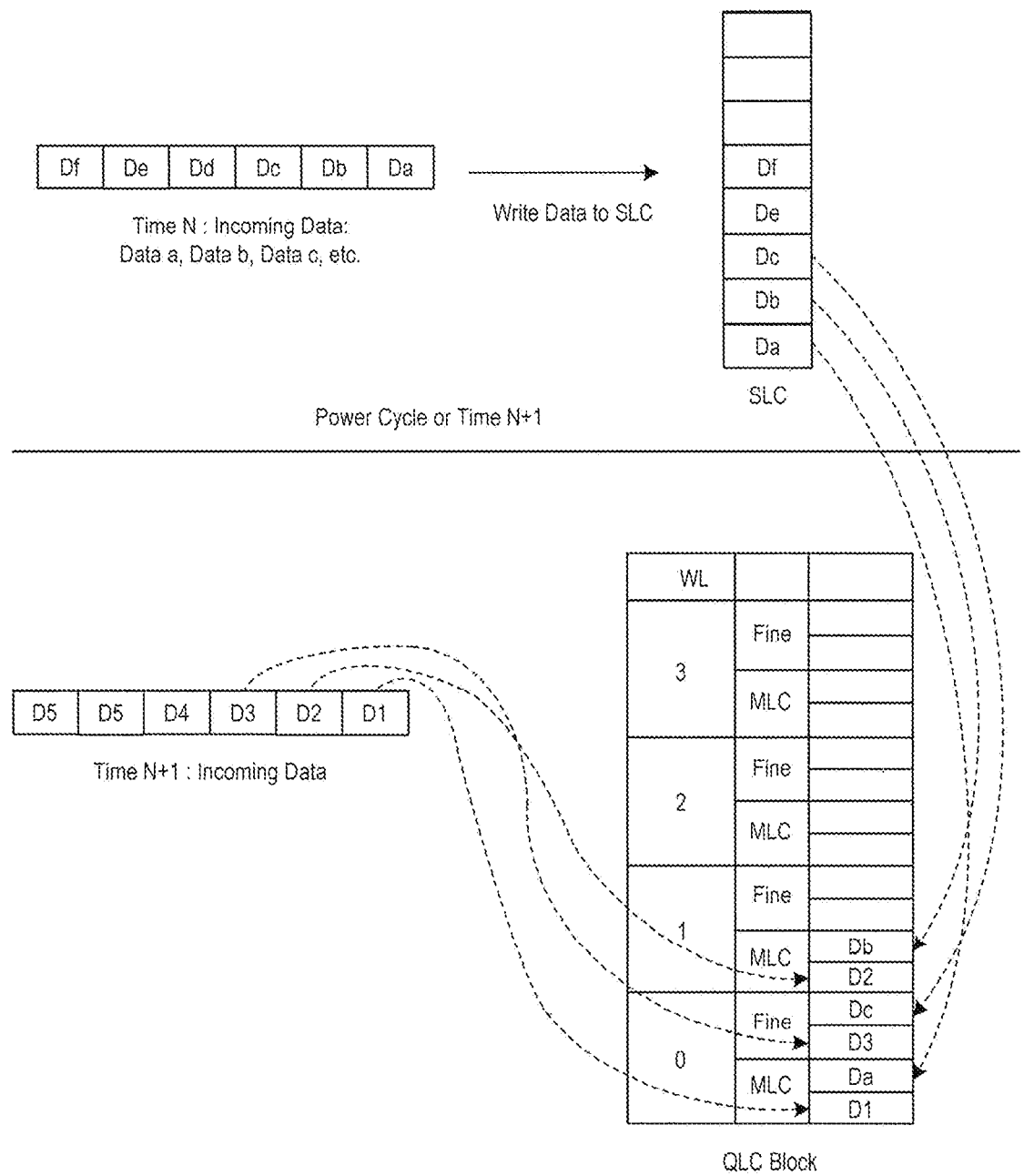
FIG. 6 is a diagram of an embodiment illustrating hybrid data routing following Foggy-Fine ordering.

In general, MLC-Fine memory needs two pages to start either the Foggy or the Fine operation (lower and middle pages are internally sensed). In one embodiment, out of these pages, one page comes from incoming host data and the other page is previously-written data that needs to be moved to a new location. FIG. 6 is a diagram of an embodiment illustrating hybrid data routing following Foggy-Fine ordering. This diagram shows data written to SLC at time 'N' and Time 'N+1' and their routing in this embodiment. In should be noted that though there could be intermixing of various logical block address (LBA) ranges, this phenomenon can be limit to a logical page. Further, flash translation layer (FTL) schemes can be used to overcome this aspect of data intermixing.

Also, it should be noted that a page of data can be sensed from the MLC memory in addition to the SLC memory. For example, due to health or fragmentation reasons, the storage device might want to move data from one QLC block to another QLC block. This internal QLC data movement can be interleaved with the host operations. Hence, whenever this kind of internal data movement is pending, at the hybrid stage, one page of data can be moved from the QLC and another page can be from incoming host data. This path may not be as common as SLC, but it still has its advantages. So, in the above example, data written at time N can be another MLC as well (and not only limited to SLC).

Figure 7:
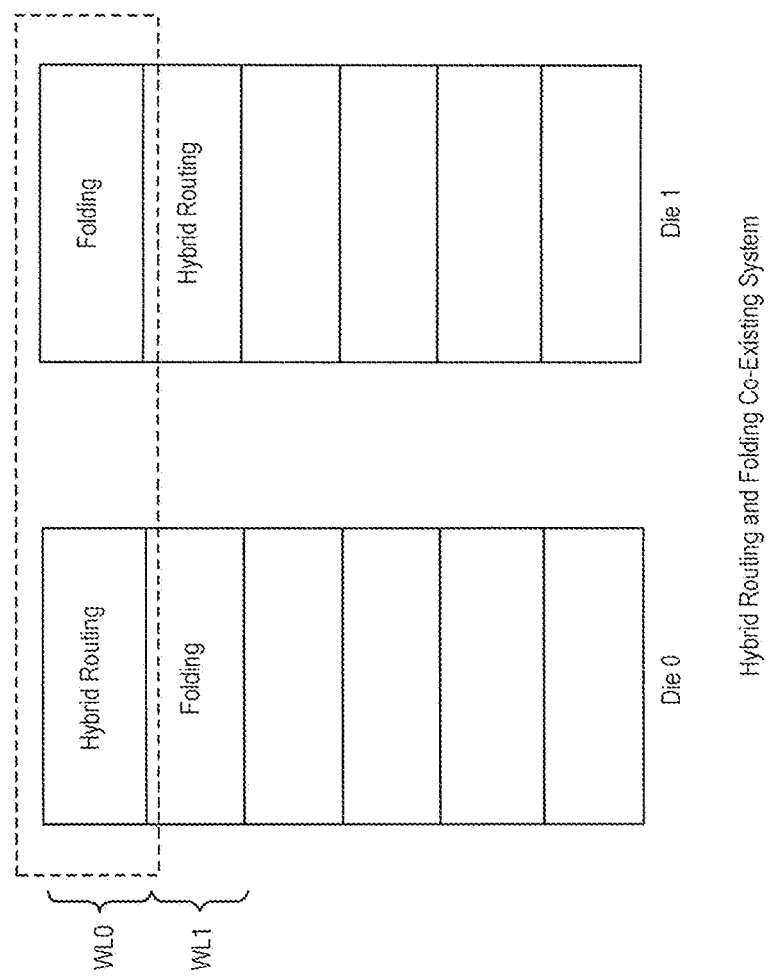
FIG. 7 is a diagram of an embodiment illustrating a hybrid routing and folding system.

As mentioned above, with this embodiment, RAM requirements are reduced by half, which also avoids 50% of SLC writes compared to folding. However, depending on controller cost, the hybrid routing scheme can be tweaked to adapt to even less RAM. For example, FIG. 7 is a diagram of an embodiment illustrating a hybrid routing and folding system in which the RAM required is one-fourth of that required for a direct write. One or few dies can use hybrid data routing while the other can use folding.

Figure 9:
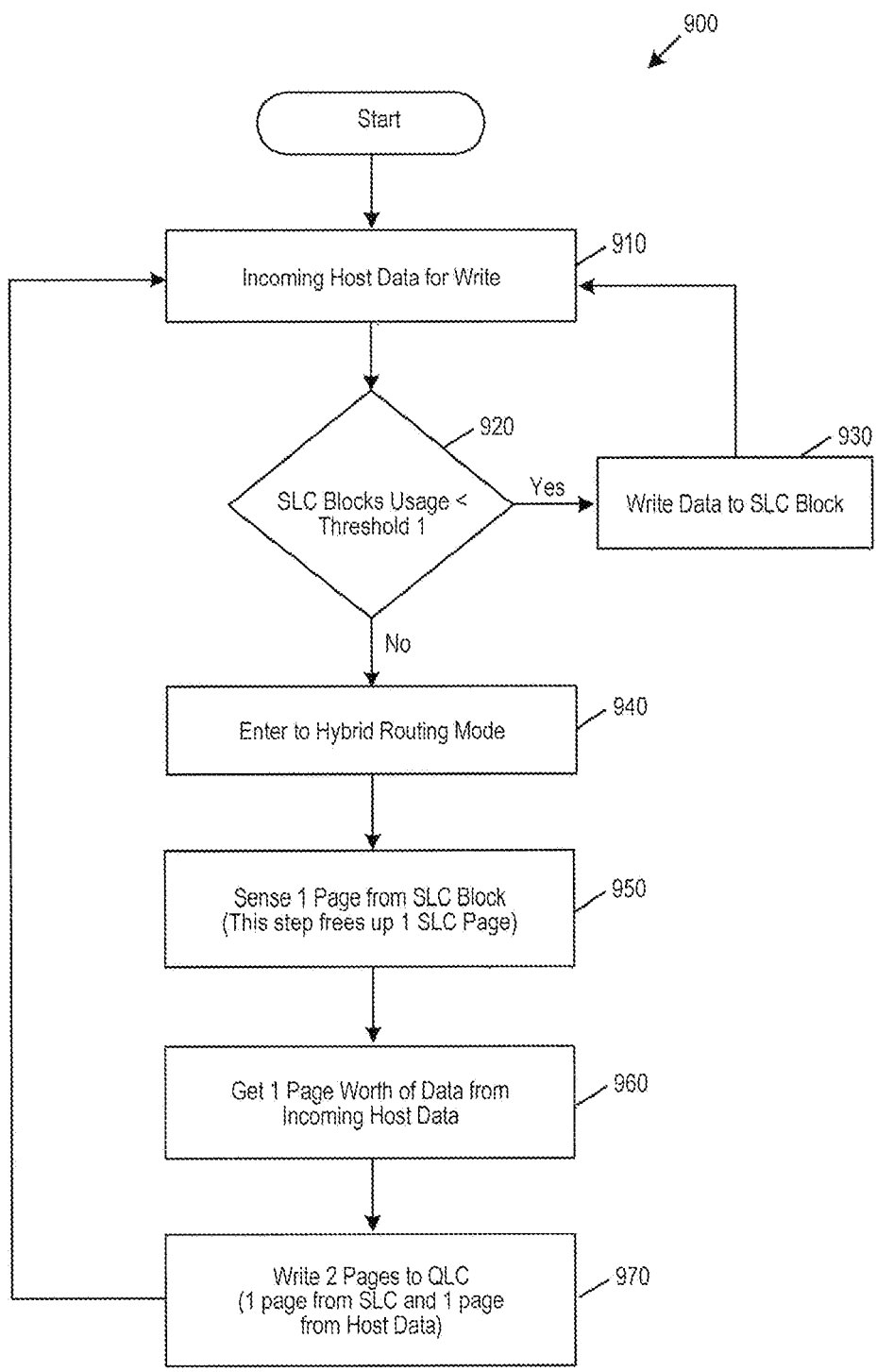
FIG. 9 is a flow chart of a method of an embodiment for hybrid routing for multi-level cell (MLC)-Fine memory.

Turning again to the drawings. FIG. 9 is a flow chart 900 of a method of an embodiment for hybrid routing for multi-level cell (MLC)-Fine memory. As shown in FIG. 9, first, the controller 102 of the storage system 100 receives incoming data from a host to be written in the memory 104 (act 910). The controller 102 determines whether the usage of the SLC blocks in the memory 104 is below a first threshold (act 920). The first threshold indicates how many SLC blocks have been consumed. This threshold can vary between various programs and can depend on how many SLC blocks can be allocated in a program. If the usage is below the first threshold, the data is written to the SLC blocks (act 930). However, if the usage is not below the first threshold, the controller 102 enters into a hybrid routing mode (act 940). In this mode, the controller 102 senses one page from the SLC block (which frees up one page) (act 950) and then gets one page worth of data from the incoming host data (act 960). The controller 104 then writes two pages to QLC memory: one page form the SLC block and one page from the host data (act 970).

Figure 10:
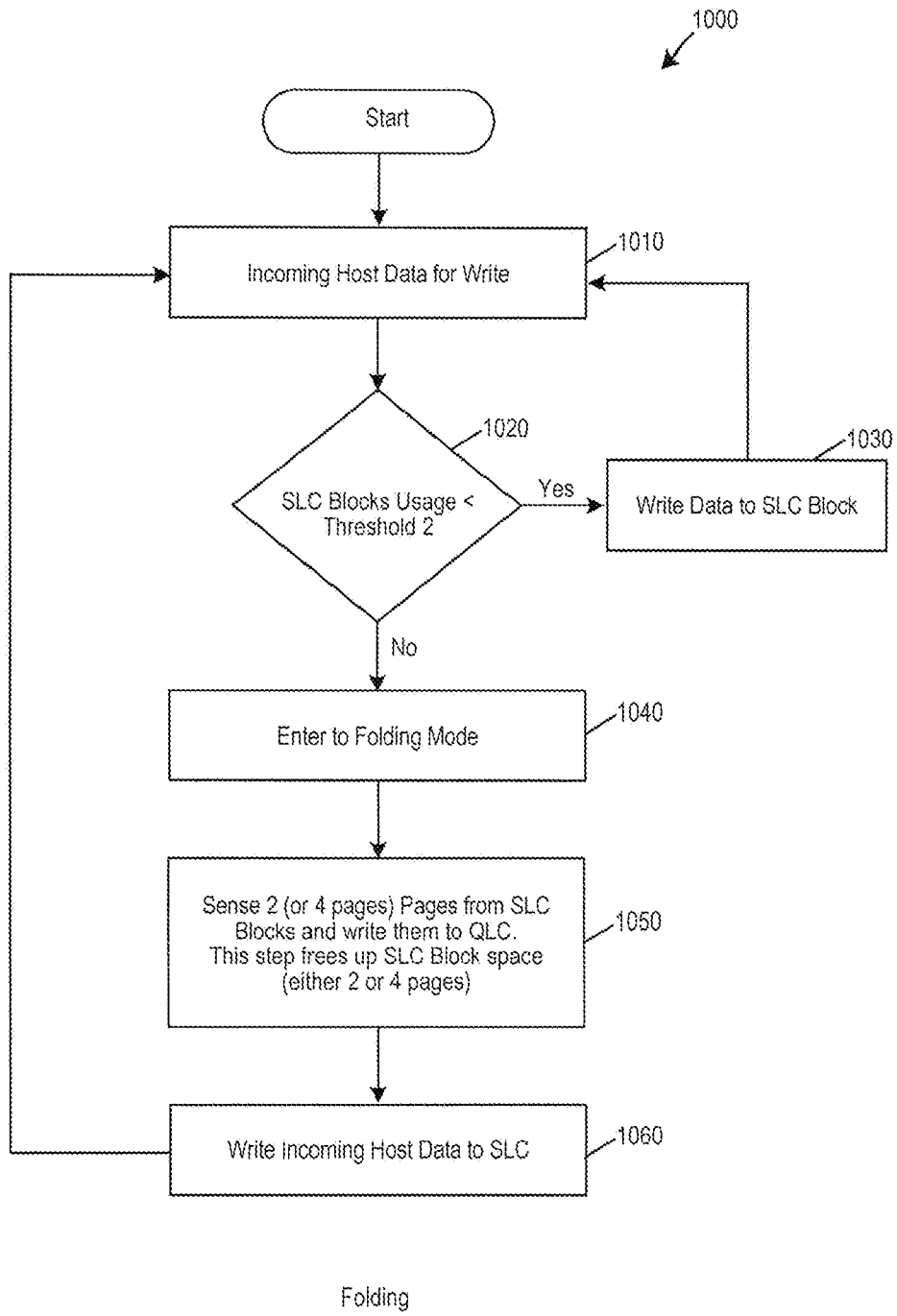
FIG. 10 is a flow chart of a folding method of an embodiment.

In contrast, FIG. 10 is a flow chart 1000 of a folding method of an embodiment. As shown in FIG. 10, first, the controller 102 of the storage system 100 receives incoming data from a host to be written in the memory 104 (act 1010). The controller 102 determines whether the usage of the SLC blocks in the memory 104 is below a second threshold (act 1020). If the usage is below the second threshold, the data is written to the SLC blocks (act 1030). However, if the usage is not below the second threshold, the controller 102 enters into a folding mode (act 1040). In this mode, the controller 102 senses two or four pages from the SLC blocks and writes the two-four pages to QLC memory (act 1050). This frees up SLC block space (e.g., either two or four pages). Then the controller 104 writes incoming data to the SLC blocks (act 1070). It should be noted that while folding is traditionally performed on four levels, folding in MLC-Fine memory can be done at the two page level.

There are many advantages associated with these embodiments. For example, these embodiments result in a lower controller RAM requirement. Consider a 16-die system for BiCS6. The RAM requirement for direct write would be 16*128 KB=2 MB, whereas the RAM requirement for hybrid routing would be 1 MB. Further, these embodiments can be adapted for controllers having even less RAM. As another example, these embodiments can be used to increase performance, as these embodiments perform fewer SLC writes compared to folding; hence, increasing the performance of the system. As yet another example, these embodiments can result in lower write amplification compared to a folding architecture, as SLC write amplification is reduced.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents that are intended to define the scope of the claimed invention. Finally, it should be noted that any aspect of any of the embodiments described herein can be used alone or in combination with one another.

What is claimed is:

1. A storage system comprising:
   a volatile memory;
   a non-volatile memory; and
   a controller configured to:
     perform a Foggy program operation in a multi-level cell (MLC) memory in the non-volatile memory by writing in the MLC memory only a part of a set of data to be written in the MLC memory; and
     perform a Fine program operation in the MLC memory by:
       reading the part of the set of data written in the MLC memory;
       reading a rest of the set of data from the volatile memory; and
       writing, in the MLC memory, the part of the set of data read from the MLC memory and the rest of the set of data read from the volatile memory.

2. The storage system of claim 1, wherein the multi-level memory cell comprises a quad-level memory cell.

3. The storage system of claim 2, wherein the part of the set of data comprises lower and middle pages of data.

4. The storage system of claim 2, wherein the rest of the set of data comprises upper and top pages.

5. The storage system of claim 1, wherein the part of the set of data is read from the MLC memory using an internal data load (IDL) read operation.

6. The storage system of claim 1, wherein the non-volatile memory comprises a three-dimensional memory.

7. In a storage system comprising a memory and a controller, a method comprising:

receiving incoming data from a host to be written in the memory;

determining whether usage of single-level cell (SLC) memory in the memory is below a threshold; and in response to determining that usage of the SLC memory in the memory is not below the threshold:
  sensing a page of data from the SLC memory; and
  writing the sensed page of data and a page of data from the incoming data in a multi-level cell (MLC) memory in the memory.

8. The method of claim 7, further comprising:
in response to determining that usage of the SLC memory in the memory is below the threshold, writing the incoming data to the SLC memory.

9. The method of claim 7, wherein the MLC memory comprises a quad-level cell (QLC) memory.

10. The method of claim 9, wherein the page of data sensed from the SLC memory comprises a lower or a middle page of data.

11. The method of claim 9, wherein the page of data from the incoming data comprises an upper or a top page.

12. The method of claim 7, wherein the page of data is sensed using an internal data load (IDL) read operation.

13. The method of claim 7, wherein the threshold varies between programs.

14. The method of claim 7, wherein the threshold varies depends on a number of SLC blocks that can be allocated in a program.

15. The method of claim 7, further comprising
sensing a page of data from the MLC memory; and
writing the sensed page of data from the SLC memory, the sensed page of data from the MLC memory, and the page of data from the incoming data in the MLC memory.

16. A storage system comprising:
a volatile memory;
a non-volatile memory;
means for performing a Foggy program operation in a quad-level cell memory in the non-volatile memory by writing two pages of data into the quad-level cell memory; and
means for performing a Fine program operation in the quad-level cell memory by:
  reading the two pages of data written to the quad-level cell memory in the Foggy program operation;
  reading two other pages of data from the volatile memory; and
  writing the two pages of data read from the quad-level cell memory and the two other pages of data read from the volatile memory in the quad-level cell memory.

17. The storage system of claim 16, wherein the two pages of data written in the Foggy program operation comprise lower and middle pages.

18. The storage system of claim 16, wherein the two other pages of data comprise upper and top pages.

19. The storage system of claim 16, wherein the two pages of data are read from the quad-level cell memory using an internal data load (IDL) read operation.

20. The storage system of claim 16, wherein the non-volatile memory comprises a three-dimensional memory.

* * * * *